(12) United States Patent
Cho et al.

(10) Patent No.: US 10,199,091 B2
(45) Date of Patent: Feb. 5, 2019

(54) RETENTION MINIMUM VOLTAGE DETERMINATION TECHNIQUES

(71) Applicant: Intel Corporation, Santa Clara, CA (US)

(72) Inventors: Minki Cho, Hillsboro, OR (US); Jaydeep Kulkarni, Portland, OR (US); Carlos Tokunaga, Hillsboro, OR (US); Muhammad Khellah, Tigard, OR (US); James Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/373,048

(22) Filed: Dec. 8, 2016

(65) Prior Publication Data

US 2018/0166145 A1   Jun. 14, 2018

(51) Int. Cl.
*G11C 5/14* (2006.01)
*G11C 11/417* (2006.01)
*G11C 11/413* (2006.01)
*G11C 29/24* (2006.01)
*G11C 29/04* (2006.01)
*G11C 29/12* (2006.01)
*G11C 29/52* (2006.01)
(Continued)

(52) U.S. Cl.
CPC ............ *G11C 11/417* (2013.01); *G11C 5/14* (2013.01); *G11C 11/413* (2013.01); *G11C 29/12005* (2013.01); *G11C 29/24* (2013.01); *G11C 29/50* (2013.01); *G11C 29/50016* (2013.01); *G11C 11/4125* (2013.01); *G11C 29/50012* (2013.01); *G11C 29/52* (2013.01); *G11C 2029/0401* (2013.01); *G11C 2029/1206* (2013.01); *G11C 2029/5004* (2013.01)

(58) Field of Classification Search
CPC ...................................................... G11C 29/52
USPC ...................................................... 365/228
See application file for complete search history.

(56) References Cited

U.S. PATENT DOCUMENTS 6,556,071 B2 * 4/2003 Notani .................... H02M 3/07
                                                326/81
8,218,376 B2 * 7/2012 Seshadri ............... G11C 11/417
                                                365/154
(Continued)

OTHER PUBLICATIONS

A. Ceratti et al., "On-Chip Aging Sensor to Monitor NBTI Effect in Nanoscale SRAM", Design and Diagnostics of Electronic Circuits & Systems (DDECS), 2012, 6 pages.
(Continued)

*Primary Examiner* — Son Mai
(74) *Attorney, Agent, or Firm* — Compass IP Law PC (57) ABSTRACT

An apparatus is described. The apparatus includes a semiconductor chip. The semiconductor chip includes a memory having multiple storage cells. The storage cells are to receive a supply voltage. The semiconductor chip includes supply voltage retention circuitry. The supply voltage retention circuitry is to determine a level of the supply voltage at which the storage cells are able to retain their respective data. The supply voltage retention circuitry is to receive the supply voltage during a stress mode of the supply voltage retention circuitry. The supply voltage retention circuitry is to more weakly retain its stored information than the storage cells during a measurement mode at which the level is determined.

19 Claims, 11 Drawing Sheets

(51) Int. Cl.
*G11C 11/412* (2006.01)
*G11C 29/50* (2006.01)

(56) References Cited

U.S. PATENT DOCUMENTS

| | | | |
|---|---|---|---|
| 8,355,277 B2* | 1/2013 | Cheng | G11C 11/413 |
| | | | 365/154 |
| 8,406,075 B2* | 3/2013 | Lee | G11C 11/413 |
| | | | 365/226 |
| 8,670,265 B2* | 3/2014 | Deng | G11C 5/14 |
| | | | 365/156 |
| 9,123,436 B2* | 9/2015 | Chiou | G06F 1/26 |
| 9,529,533 B1* | 12/2016 | Dreesen | G06F 3/0608 |
| 2012/0221917 A1* | 8/2012 | Bueb | G06F 11/1012 |
| | | | 714/755 |
| 2013/0285685 A1 | 10/2013 | Bowman et al. | |

OTHER PUBLICATIONS

A. Raychowdhury et al., "Tunable Replica Bits for Dynamic Variation Tolerance in 8T SRAM Arrays", IEEE Journal of Solid-State Circuits, vol. 46, No. 4, Apr. 2011, pp. 797-805.

N. Kurd et al., "Haswell: A Family of IA 22nm Processor", IEEE Journal of Solid-State Circuits, Vol. 50, No. 1, Jan. 2015, 1 pp. 49-58.

S. Kim et al., "Enabling Wide Autonomous DVFS in a 22nm Graphics Execution Core Using a Digitally Controlled Hybrid LDO/Switched Capacitor VR with Fast Droop Mitigation", ISSCC 2015/Sessions 8/Low-Power Digital Techniques/8.6., 3 pages.

C. Tokunaga et al., "A Graphics Execution Core in 22nm CMOS Featuring Adaptive Clocking, Selective Boosting and State Retentive Sleep", ISSCC Feb. 2014.

* cited by examiner

Fig. 5 ns. As observed in FIG.
RETENTION MINIMUM VOLTAGE DETERMINATION TECHNIQUES

FIELD OF INVENTION

The field of invention pertains generally to electronic circuitry, and, more specifically, to improved retention minimum voltage determination techniques

BACKGROUND

The power consumption of an electrical circuit is in many cases a critical aspect of the circuit's performance metric. In the case of battery powered devices, for instance, the amount of power that a semiconductor chip will draw from the batter has a significant impact on the enjoyment of the device by the user and the device's ability to compete with other battery powered devices on the open market. As such, engineers are continually seeking ways to lessen the power consumption of the circuits they design.

FIGURES

A better understanding of the present invention can be obtained from the following detailed description in conjunction with the following drawings, in which.

DETAILED DESCRIPTION

The constituent transistors of a semiconductor chip tend to age over the active lifetime of the semiconductor chip. To account for the aging of the transistors, wide guard bands are imposed on the operational specifications of the semiconductor chip that, in turn, correspond to undesirable inefficiencies in the semiconductor chip's operation.

Specifically, as a transistor ages it becomes slower (it's turn-on threshold voltage rises and/or its gain decreases). Increasing the semiconductor chip's supply voltage, however, will increase the speed of the semiconductor chip's aging transistors. As such, a larger minimum supply voltage is specified for the semiconductor chip so that a sufficient amount of supply voltage is provided to the semiconductor chip's transistors over the course of the semiconductor chip's lifetime that permit the semiconductor chip to operate at least a minimum specified clock speed for its entire life.

Additionally, in the case of a memory circuit (e.g., a static random access memory (SRAM)), as the transistors of a memory cell age the cell needs to be supplied with a larger supply voltage in order to prevent the cell from losing its stored data. As such, a larger minimum supply voltage is specified for the semiconductor chip so that a sufficient supply voltage is applied to the memory circuit's memory cells so that they retain their data over the course of the semiconductor chip's lifetime.

Thus, the specified minimum supply voltage for a semiconductor chip is set at an artificially high level over the earlier timeframe of the semiconductor chip's operational lifetime. In the early stages of the semiconductor chip's lifetime, the semiconductor chip's transistors have not substantially aged. As such, they could operate at a lower supply voltage. However, the minimum supply voltage is established to a higher voltage to ensure that the transistors will receive sufficient supply voltage when they eventually age later on in the semiconductor chip's lifetime. The artificially high supply voltage that is supplied to the semiconductor chip early in it's life corresponds to inefficiency in that the semiconductor chip consumes more power with the artificially high supply voltage that it otherwise needs to.

Figure 1A:
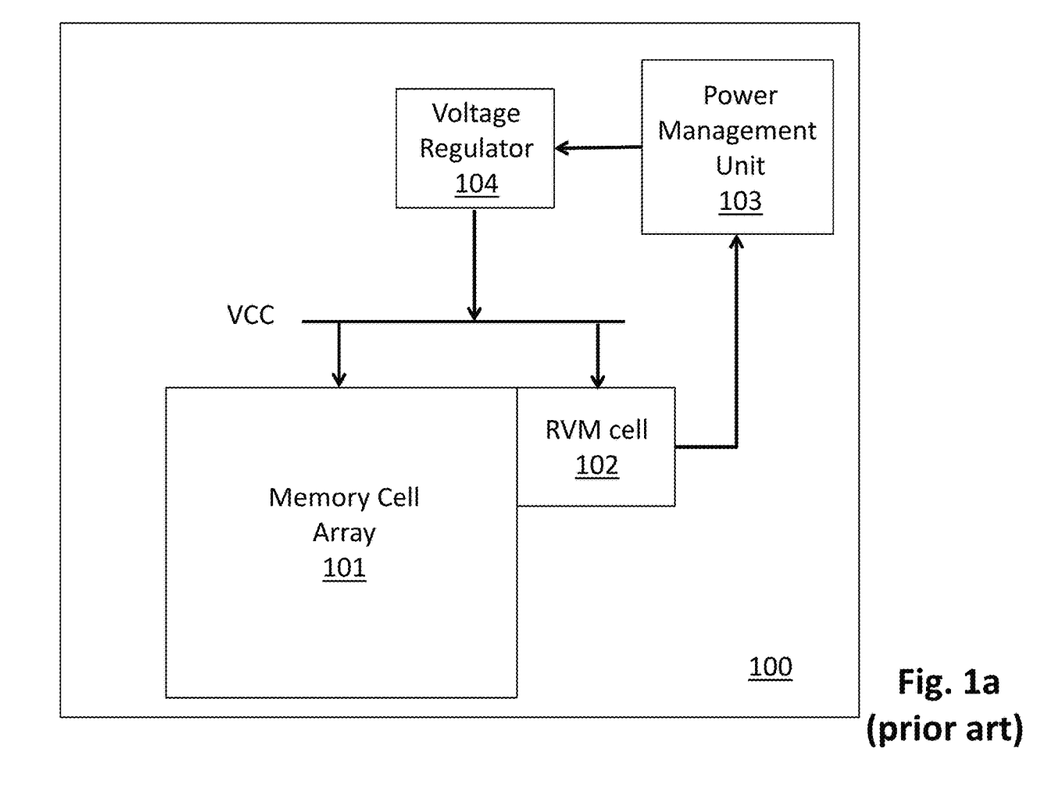
FIG. 1a depicts a prior art power management design.

FIG. 1a shows a prior art semiconductor chip 100 design that attempts to internally modulate the semiconductor chip's supply voltage VCC based on the measured aging of the semiconductor chip's transistors. As observed in FIG. 1a, the semiconductor chip 100 includes a memory array 101 and retention Vmin monitor (RVM) circuitry 102. The RVM circuitry 102 acts as a test cell associated with the memory array 101 that is designed to measure the minimum supply voltage at which the storage cells in the memory array 101 can reliably keep their stored information.

Initially, in the early life of the semiconductor chip 100, the RVM circuitry 102 indicates that the storage cells in the memory array 101 can retain their data with a particularly low supply voltage. Data from the RVM circuitry 102 reaches a power management controller 103 which sets a low supply voltage for the semiconductor chip 100. As such, the aforementioned inefficiency is alleviated because the semiconductor chip 100 is able to operate at a lower supply voltage during its early life.

Over time, as the semiconductor chip's transistors age, the RVM circuitry 102 indicates that a higher supply voltage is needed to ensure that the memory array cells will be able to keep their data. Data from the RVM circuitry 102 reaches the power controller 103 which sets the supply voltage to a higher voltage. This behavior increases over time with the RVM circuitry 102 indicating an even higher voltage is needed and the power management circuitry 103 providing the higher voltage over the lifetime of the semiconductor chip 100. In this manner, the aforementioned supply voltage inefficiency is avoided because the semiconductor chip 100 scales up its supply voltage on an as-needed basis rather than running its supply voltage at an end of life worst case level over its entire lifetime.

Figure 1B:
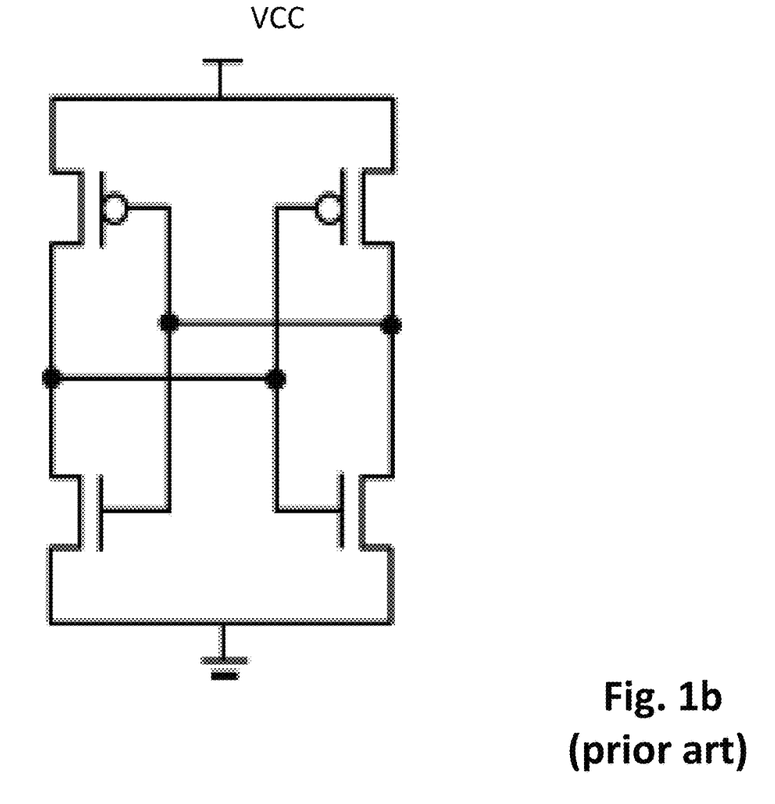
FIG. 1b depicts a first prior art RVM cell.
Figure 1C:
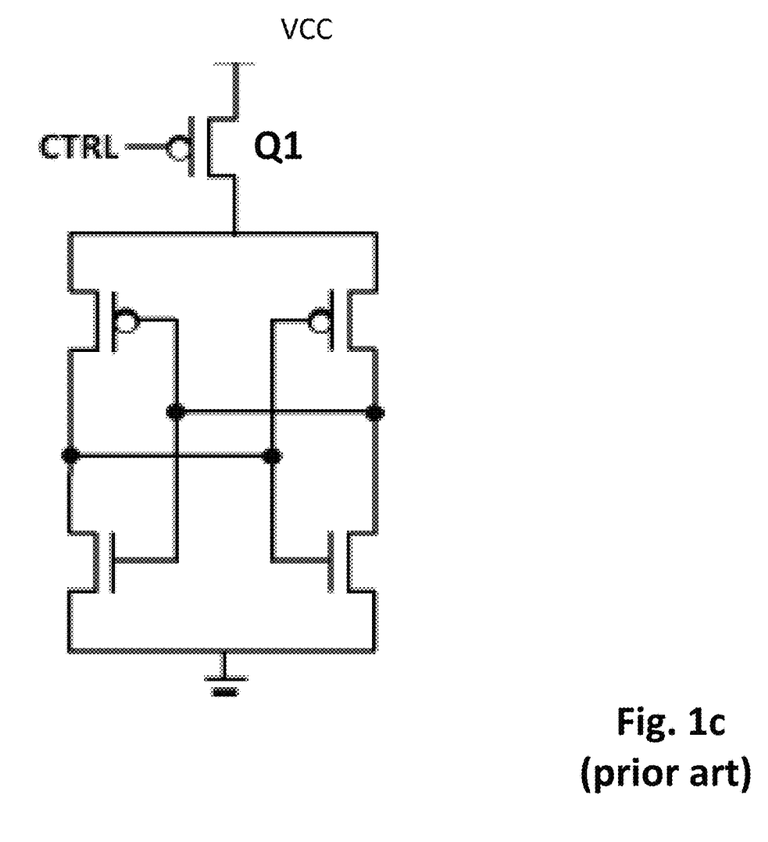
FIG. 1c depicts a second prior art RVM cell.

FIGS. 1b and 1c show prior art RVM test cell circuits. With respect to the RVM circuit of FIG. 1b, the RVM circuit may be identical to a storage cell circuit within the actual memory array (those of ordinary skill will recognize that the circuit of FIG. 1b corresponds to a standard 6T-SRAM cell). By contrast, the circuit of FIG. 1c includes a control transistor Q1 between its VCC supply rail and the memory cell.

With respect to the RVM circuit of FIG. 1b, the RVM circuit receives the same stress as the actual memory cells in the memory array because it receives the same supply voltage that they receive. However, the RVM circuit of FIG. 1b does not provide adequate headroom between when it indicates the supply voltage is too low for the safe keeping of its stored data and when the memory cells in the actual memory begin to actually fail because the supply voltage is too low. That is, because the RVM cell of FIG. 1b is stressed and measured at the same conditions as the actual memory cells in the memory cell array, the RVM cell of FIG. 1b could only be expected to reveal that a problem is imminent at about the same time that the actual memory cells begin to fail. This leaves the system little or no time to adjust its memory supply voltage.

The RVM circuit of FIG. 1c attempts to improve upon the problem with the RVM circuit of FIG. 1b by including control transistor Q1. Here, a control voltage is placed on the gate of the control transistor Q1 to affect the supply voltage that is provided to the storage cell. Specifically, the control voltage only weakly or modestly turns on the control transistor Q1 which increases its channel resistance thereby inducing a voltage drop across the control transistor Q1, The voltage drop across the control transistor Q1, in turn, lowers the supply voltage that is applied to the storage cell.

With a lowered supply voltage, the RVM cell of FIG. 1c should exhibit failures before the actual storage cells in the memory array. That is, the voltage margin of the RVM cell of FIG. 1c is by design less than the voltage margin of the actual storage cells in the memory array. Unfortunately, because the RVM cell continuously receives the lower supply voltage it is not stressed to the same degree as the actual storage cells in the memory array (which receive a higher supply voltage since their cells do not include the control transistor Q1).

The lesser stress received by the RVM cell of FIG. 1c offsets its tendency to exhibit errors sooner because of its lesser supply voltage. As such, it is not a truism that the RVM circuit of FIG. 1c will exhibit errors before the actual storage cells within the memory array. Thus the RVM circuit of FIG. 1c does not emphatically improve upon the deficiency of the RVM circuit of FIG. 1b in that it does not necessarily provide an early enough warning signal that the supply voltage presently being supplied to the actual memory array is encroaching into a realm that is too low to ensure its stored data will be kept.

A solution is to design an RVM cell whose ability to hold its data is weakened when its data is being read to measure whether the RVM cell is failing or not, and, while the RVM cell is being stressed (e.g., during extended periods of time in between periodic measurement modes in which the stored data integrity is checked with lesser supply voltage), the RVM cell receives the full supply voltage so that it is stressed approximately the same as the actual memory storage cells in the memory array.

FIGS. 2a through 2d show various embodiments of RVM cells that incorporate this design approach. With respect to the RVM cell of FIG. 2a, the supply voltage path to the RVM storage cell includes two paths: 1) a first path through Q3 that applies the full supply voltage to the RVM cell 201_1 to stress the cell 201_1 approximately the same way the actual storage cells in the memory array are being stressed; and, 2) a second path through Q4 that applies a lowered supply voltage to the RVM cell 201_1 when it is being measured to understand, at current stress levels, if the lowered supply voltage is sufficiently low to cause the RVM cell to fail to store its data correctly. If so, the RVM cell will have provided an "early warning" that the supply voltage has not yet reached, but will soon reach, a level where the cells of the memory array will begin to exhibit errors. With a viable early warning indicator, the supply voltage can be raised before any cells in the memory array actually begin to fail.

Here, diode transistor Q4 causes a forward bias voltage drop to occur on the supply voltage rail that feeds the RVM cell 201_1 while its stored data is being read during a measurement or sampling mode. In the sampling mode, transistor Q3 is turned off to force the supply current to flow through transistor Q4 thereby inducing the aforementioned supply voltage drop. The supply voltage drop induced by the diode transistor Q4 "weakens" the cell's ability to keep its stored data, similar to the control transistor Q2 of FIG. 1c. However, in the case of the cell of FIG. 2a, the cell is only weakened with a lesser supply voltage for the read operation performed during the measurement mode. During stress mode, the cell is not substantially supplied through the diode transistor Q4 but is instead supplied through the stress transistor Q3 which is strongly on while the RVM cell is being stressed. Because the stress transistor Q3 is strongly on during stress it has very low channel resistance and thereby negligible voltage drop across it. As such, during stress, the RVM cell receives the full VCC supply voltage. As mentioned just above, to measure the cell's stored data during (e.g., periodic) measurement modes in between extended stress times, the stress transistor Q3 is turned off which forces all supply current to flow through the diode transistor Q4 which weakens the cell by lowering its supply voltage during the read mode.

Figure 2A:
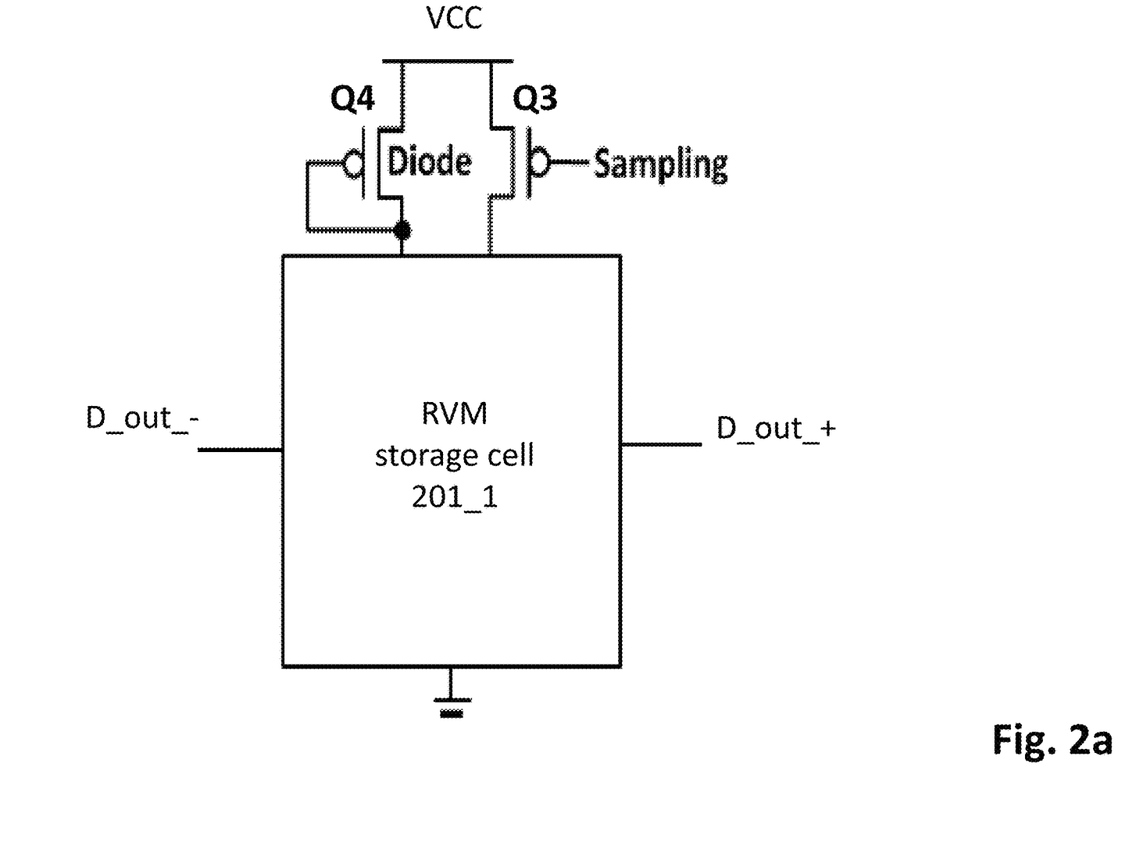
FIG. 2a depicts a first improved RVM cell.
Figure 2B:
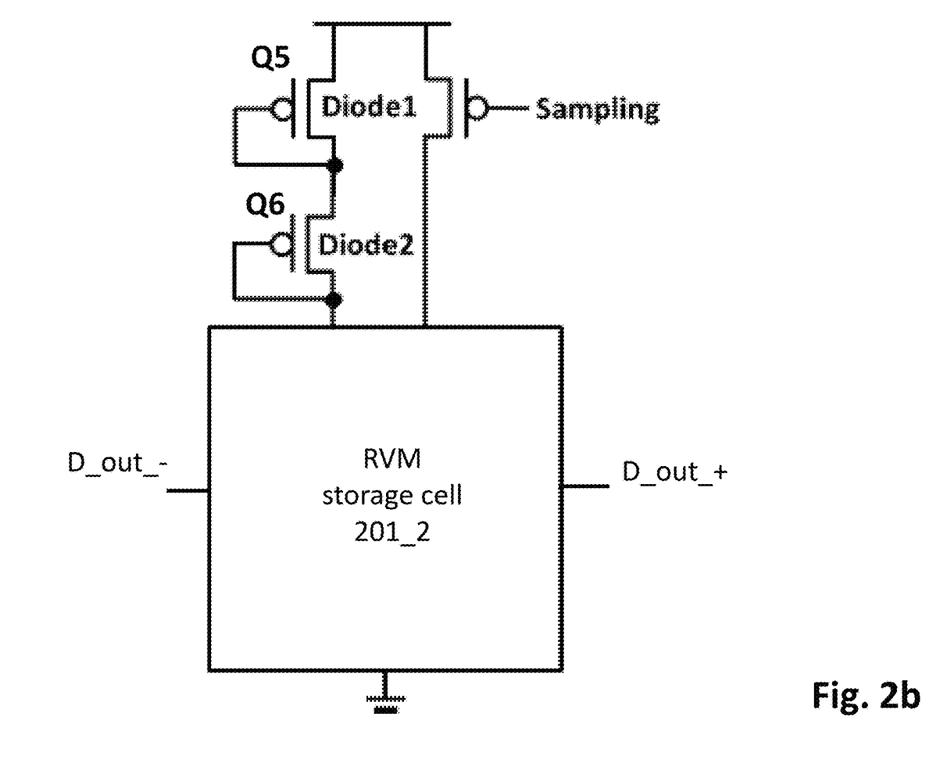
FIG. 2b depicts a second improved RVM cell.

The RVM embodiment of FIG. 2b, like the approach of FIG. 2a, induces a voltage drop along the supply voltage path during measurement read mode but induces even more supply voltage drop than the circuit of FIG. 2a. That is whereas the RVM circuit of FIG. 2a induces one forward bias voltage drop along the supply rail during test mode, by contrast, the RVM circuit of FIG. 2b induces two forward bias voltage drops along the supply rail during test mode by way of pair of diode transistors Q4 and Q5. As such, the RVM circuit of FIG. 2b should provide an even earlier warning signal than the RVM circuit of FIG. 2a.

Figure 2C:
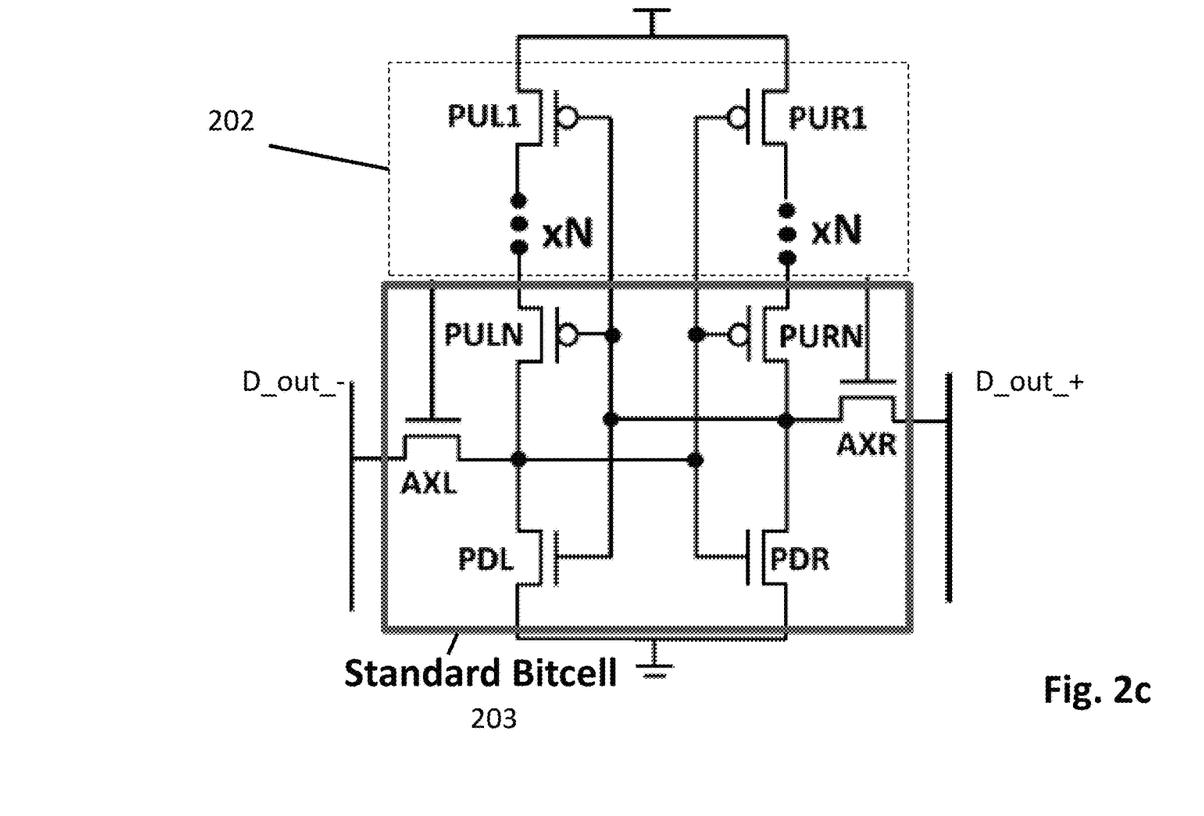
FIG. 2c depicts a third improved RVM cell.

The RVM circuit of FIG. 2c includes multiple pull-up transistors 202 along each leg instead of only a single pull-up transistor along each leg (PULN, PURN) as is common in a traditional storage cell 203. Here, the more pull-up transistors that are chained together, the weaker their pull-up effect. As such, the output nodes of the RVM cell of FIG. 2c have a propensity to be pulled down rather than pulled-up. If, for instance, the gain of the pull-up transistors 202 of the RVM cell of FIG. 2c diminish through aging, the RVM cell of FIG. 2c may reach a point where one of its output nodes is not able to be pulled up to a logic high when a logic high at the output node corresponds to correctly stored data. Upon such a point being reached, the RVM cell is failing which corresponds to a warning signal that the supply voltage to the memory array should be raised soon.

Note that the RVM cell of FIG. 2c as drawn does not include a voltage drop along its supply rail during read mode. That is, in the approach of FIG. 2c, the RVM cell is weakened with extra pull-up transistors 202 rather than with a lower supply voltage. As such the circuit does not need two supply paths as with the approaches of FIGS. 2a and 2b. Because the cell is tied directly to the supply voltage its constituent transistors are stressed in-step with the transistors of the actual storage cells in the memory array. Nevertheless in yet other embodiments the RVM cell of FIG. 2c may be designed with, e.g., a diode transistor and a stress transistor to establish two supply paths (one for stress the other for measurement) similar to the approaches of FIGS. 2a and 2b. Here, the lower supply voltage during measurement mode weakens the RVM cell even further which will cause it to provide a warning signal even earlier that the embodiment of FIG. 2c.

Figure 2D:
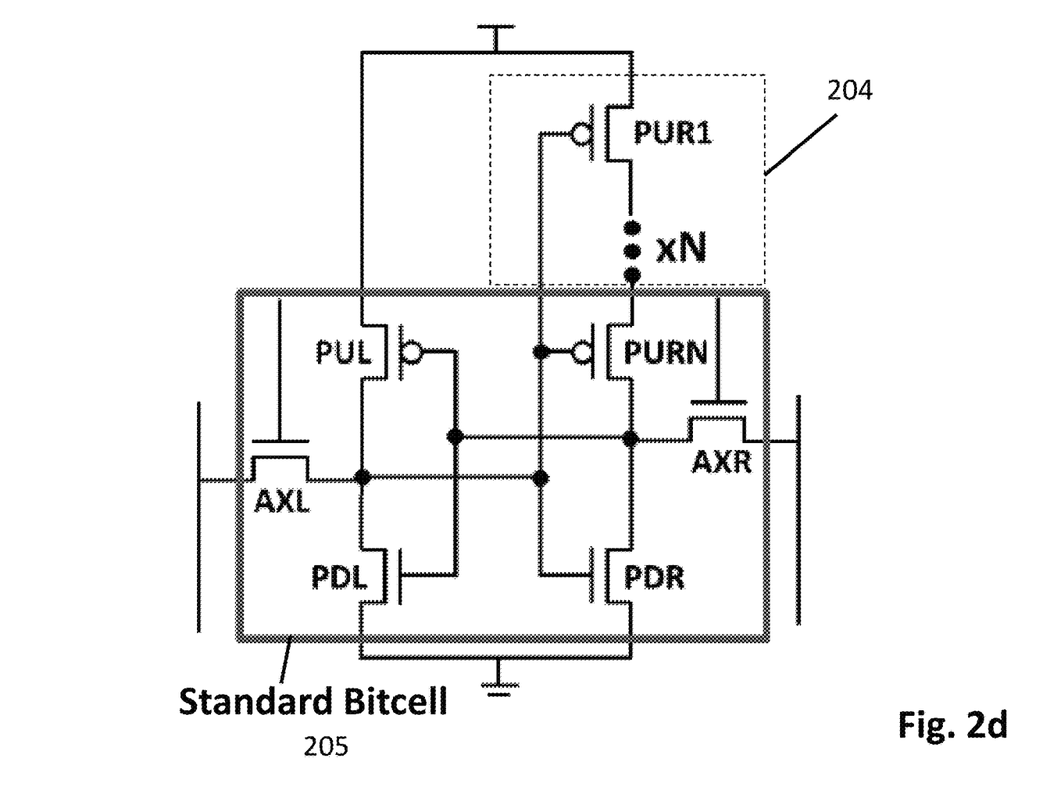
FIG. 2d depicts a fourth improved RVM cell.

The RVM circuit of FIG. 2d also includes multiple pull-up transistors 204 but only along one leg of the cell. Here, the RVM storage cell of FIG. 2d (like the storage cells of FIGS. 2a through 2c) are understood to be differential in that the storage of data is effected by one leg keeping a logic high and the other leg keeping a logic low. In this sense, the operation of the storage cell can be viewed as being balanced. By contrast, with only one leg having multiple pull-up transistors 204, the balanced nature of the storage cell is adversely affected. Specifically, the leg having multiple pull-up transistors 204 will have less of an ability to pull-up its output node to a logic high than the leg having only one, traditional pull-up transistor (PUL).

With this imbalance, the RVM cell of FIG. 2d will not be able to store a logic value that corresponds a logic high value on the leg with multiple pull-up transistors (a first state) as reliably as it can store a logic value that corresponds to a logic low value on the leg with multiple pull-up transistors (a second state). As such, the RVM cell of FIG. 2d will have a tendency to stick in the second state rather than the first state. In an embodiment, the cell is loaded with data that corresponds to the first state and when the cell is observed to have flipped to the second state, the failure corresponds to an early warning sign that the supply voltage should be raised soon.

As with the RVM cell of FIG. 2c, the RVM cell of FIG. 2d does not need two supply paths as with the approaches of FIGS. 2a and 2b. Because the cell is tied directly to the supply voltage its constituent transistors are stressed in-step with the transistors of the actual storage cells in the memory array. Nevertheless, in other embodiments, the RVM cell of FIG. 2d may be designed with, e.g., two supply paths (one for stress the other for measurement) similar to the approaches of FIGS. 2a and 2b. Here, the lower supply voltage during measurement mode weakens the RVM cell even further which will cause it to provide a warning signal even earlier that the embodiment of FIG. 2d.

The discussion above of FIGS. 2a through 2d demonstrated only some of the ways in which an RVM cell can be weakened for its measurement read but will still be stressed at full supply voltage. Those of ordinary skill will understand that a vast number of other RVM cell designs may be utilized to achieve this particular objective.

Figure 3A:
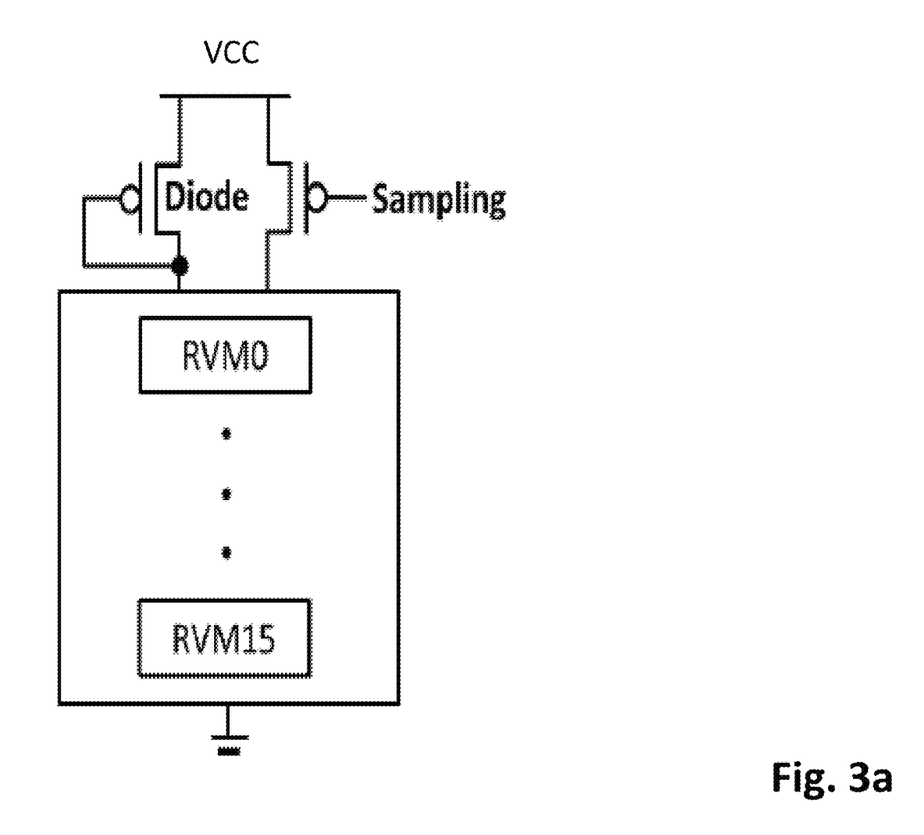
FIG. 3a depicts a first multiple RVM cell implementation.

FIG. 3a shows an embodiment of a multiple RVM cell implementation. Here, storage cell failures are a function of manufacturing process variations that cause some transistors to age faster than other transistors. As such, having multiple RVM cells designed into a same semiconductor chip provides for a greater spread of RVM cell performance (some RVM cells will fail before other RVM cells). The decision point as to when the supply voltage should be raised because of RVM cell failure(s) can be a function of, e.g., the number of RVM cells that have been observed to fail.

For example, if the RVM cells have been designed to be particularly weak during a measurement read (e.g., they have multiple pull-up transistors and a lowered read supply voltage), the decision to raise the supply voltage may require failure of multiple RVM cells. By contrast, if the RVM cells are designed to be less weak during a measurement read (e.g., only a small supply voltage drop is effected during a measurement read), the decision to raise the supply voltage may require failure of fewer (e.g., just one) RVM cell. In the particular embodiment of FIG. 3a note that all sixteen RVM cells are supplied by the two paths through the stress and diode transistors.

Figure 3B:
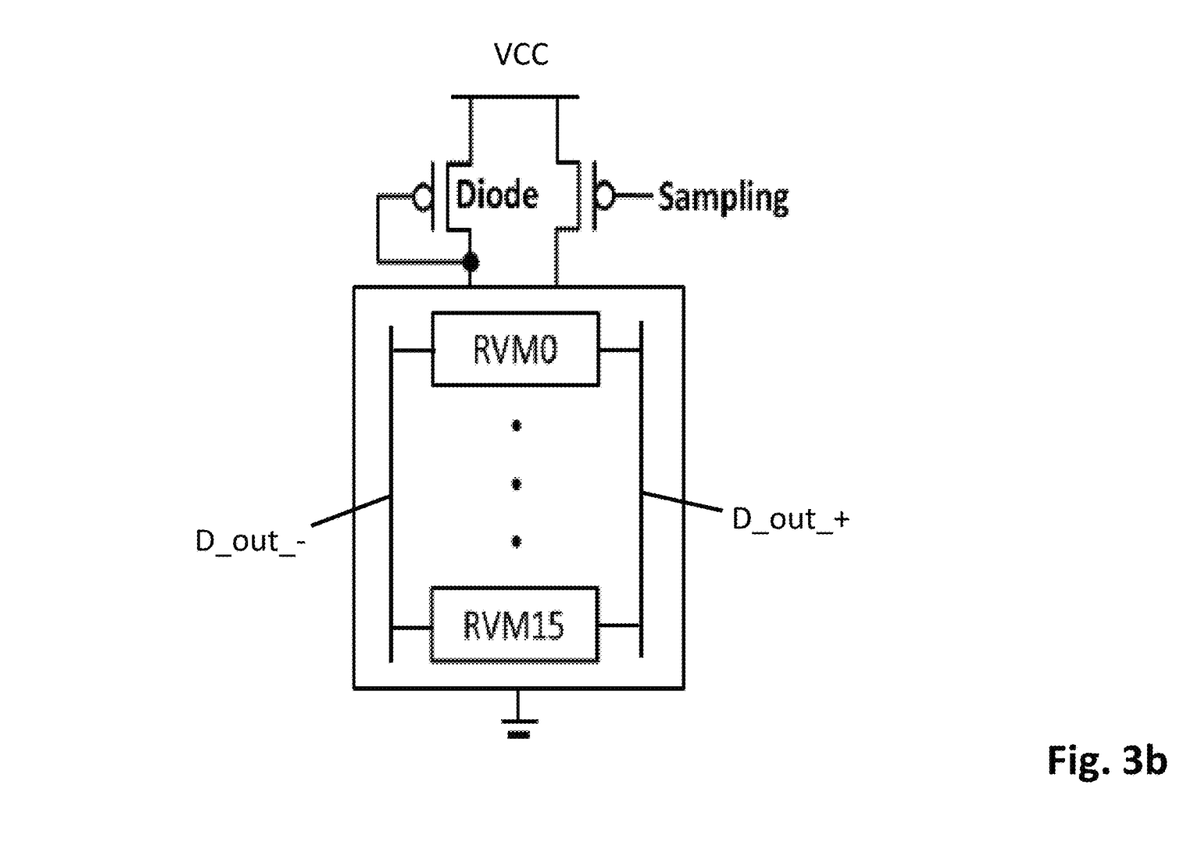
FIG. 3b depicts a second multiple RVM cell implementation.

In various embodiments, as observed in FIG. 3b, the performance of the RVM cells may be averaged together by tying their input and output nodes together. As can be seen in FIG. 3b, each RVM cell is effectively coupled in parallel in that its input and output nodes are coupled to the same node. Coupling the RVM cells in this manner allows for multiple mechanisms to trigger an error during a measurement read, which, in turn, reflects the overall performance of the set of RVM cells.

For example, incorrect data may be read at the output if any of the following situations arise: more than half of the RVM cells weakly fail (each cell only weakly pulls the output data nodes toward the wrong logic level but more than half of the cells pulling in this manner is sufficient to pull the entire data node to the wrong level), a few RVM cells fail with some strength (a few failing RVM cells pull the data output nodes with enough strength to over-ride the other correctly working RVM cells and place the output data nodes at the wrong logic level), one RVM cell fails with tremendous strength (the one cell pulls the data output node with enough strength to over-ride all the other RVM cells).

Figure 4:
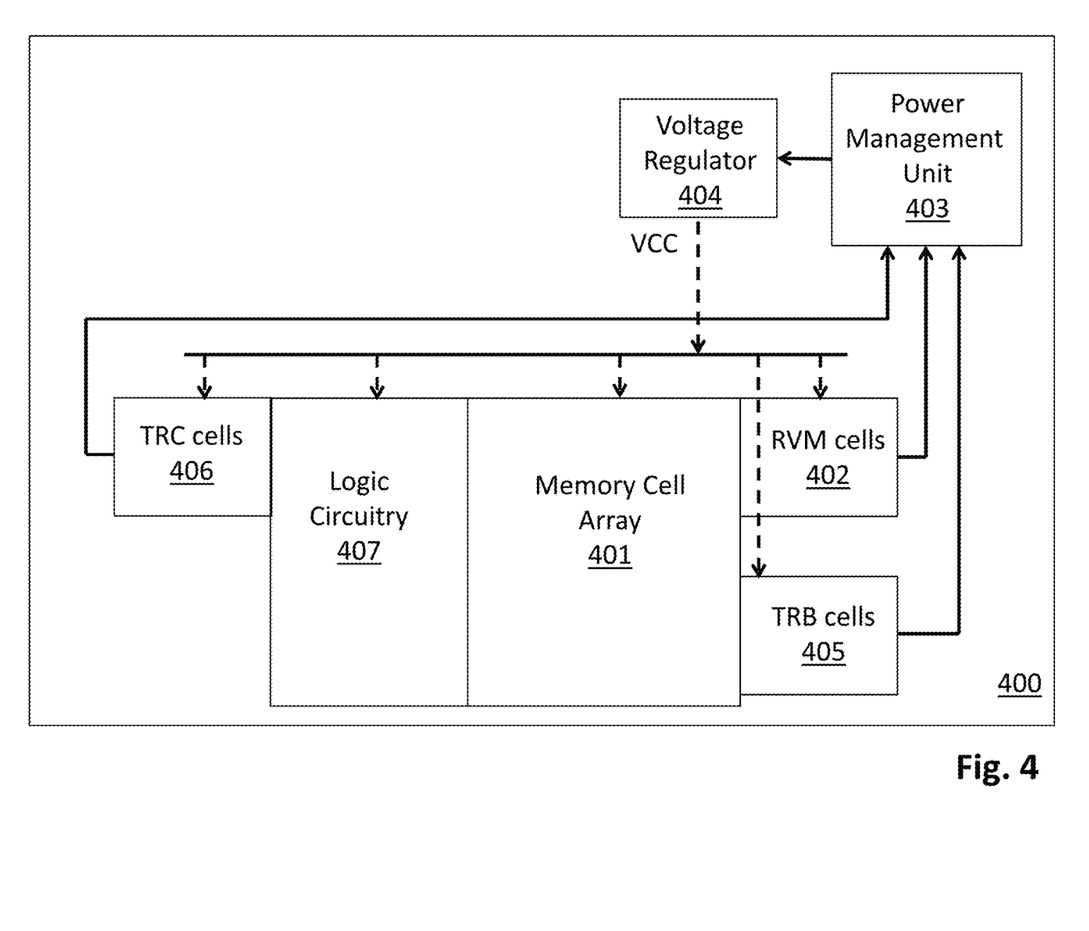
FIG. 4 depicts a semiconductor chip having different kinds of aging monitors.

FIG. 4 shows an extended semiconductor chip 400 embodiment that not only includes RVM cells 402, but also other test cells to increase the supply voltage of the memory array or logic of the semiconductor chip based on other failure criteria. For example, tunable replica bit (TRB) cell circuitry 405 measures the speed/timing of the memory array's storage cells (as opposed to the RVM cells 402 which measure the minimum voltage needed by the cells to keep their data) and tunable replica circuit (TRC) circuitry 406 the speed/timing of the semiconductor chip's logic circuitry 407.

Besides the RVM cell 402 failures, the supply voltage can also be raised if either the TRB 405 or TRC 406 cells exhibit sufficient failures. As such, each of these test cells 402, 405, 406 are coupled to the power management unit 403 which controls the supply voltage via voltage regulator 404 in response thereto. Some semiconductor chips may have different supply voltage rails as between the memory array 401 and the logic circuitry 407. If so, the RVM 402 and TRB cell 405 performance will affect the memory array supply voltage and the TRC circuitry 406 will affect the logic circuitry supply voltage. Here, different voltage regulators may be employed to effect the two different supply voltages. A common power management unit may control both regulators or there may be separate power management units coupled to the appropriate respective test cells and regulators.

Figure 5:
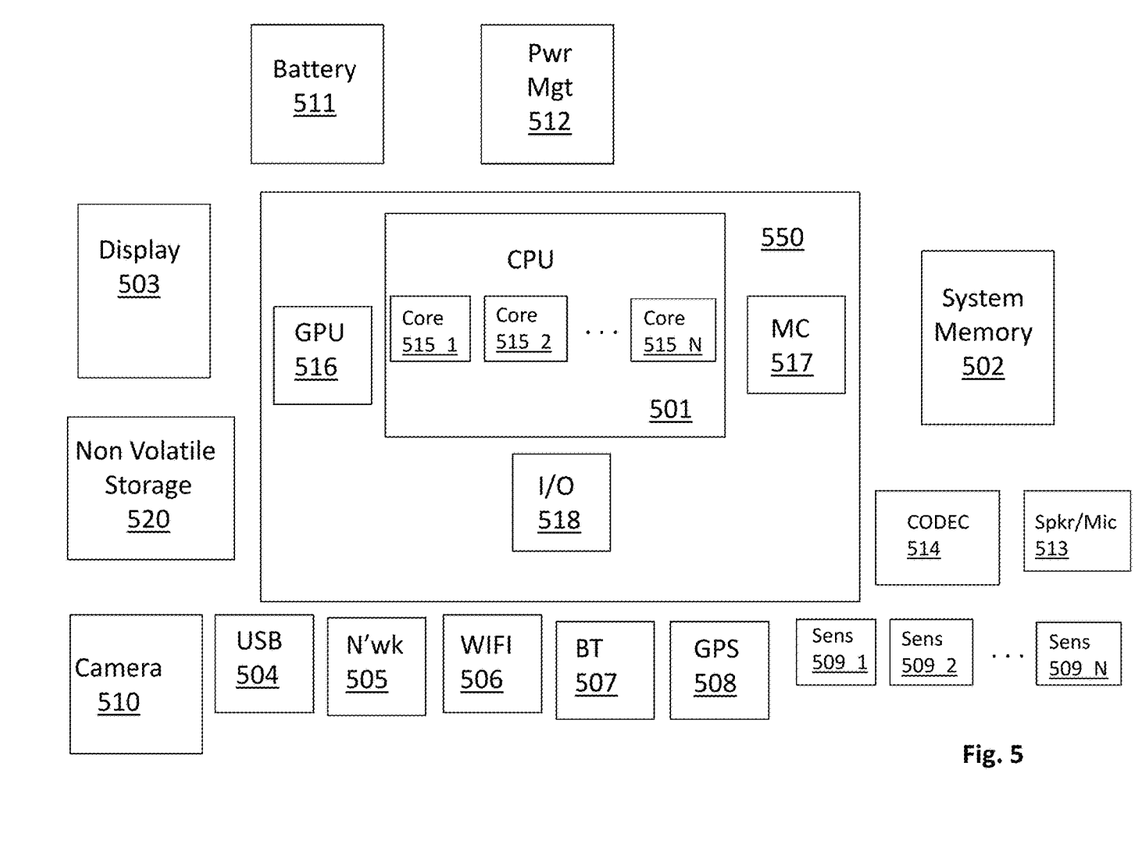
FIG. 5 depicts a computing system.

FIG. 5 shows a depiction of an exemplary computing system 500 such as a personal computing system (e.g., desktop or laptop) or a mobile or handheld computing system such as a tablet device or smartphone, or, a larger computing system such as a server computing system. As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502. The system memory 502 may be a multi-level system memory.

Much of the computing system observed in FIG. 5 (e.g., the processing cores, the main memory controller, the I/O control hub) may be integrated on a same semiconductor chip having on-chip memory where the on-chip memory has associated RVM cells as discussed at length above. TRC and TRB cells may also be integrated on the semiconductor chip as discussed above with respect to FIG. 4. In various embodiments, the on-chip memory is used to implement a cache for a plurality of processing cores that are disposed on the semiconductor chip.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550. The mass storage of the computing system may be implemented with non volatile storage 520 which may be coupled to the I/O controller 518 (which may also be referred to as a peripheral control hub).

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of software or instruction programmed computer components or custom hardware components, such as application specific integrated circuits (ASIC), programmable logic devices (PLD), digital signal processors (DSP), or field programmable gate array (FPGA).

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip, comprising:
a memory comprising multiple storage cells, said storage cells to receive a supply voltage; and,
retention voltage determination circuitry, said retention voltage determination circuitry to determine a level of said supply voltage at which said storage cells are able to retain their respective data, said retention voltage determination circuitry comprising a storage cell to receive said supply voltage during a stress mode of said retention voltage determination circuitry, said retention voltage determination circuitry to apply a voltage that is less than said supply voltage to said storage cell during a measurement mode of said retention voltage determination circuitry to cause said storage cell to more weakly retain its stored information than said storage cells during said measurement mode.

2. The apparatus of claim 1 wherein said retention voltage determination circuitry comprises a first supply current path and a second supply current path, the first supply current path to impose negligible supply voltage drop, the second supply current path to impose a non-negligible supply voltage drop, the first supply current path to be enabled during the stress mode, the second supply current path to be enabled during the measurement mode.

3. The apparatus of claim 2 wherein the second current path comprises one or more diodes.

4. The apparatus of claim 1 wherein said storage cell has more pull-up transistors than respective ones of said storage cells.

5. The apparatus of claim 1 wherein said retention voltage determination circuitry comprises different numbers of transistors on different legs of said supply voltage retention circuitry.

6. The apparatus of claim 1 wherein said semiconductor chip comprises a power management controller and said retention voltage determination circuitry is coupled to said power management controller.

7. The apparatus of claim 6 wherein said semiconductor chip comprises a plurality of retention voltage determination circuits for said memory coupled to said power management controller, said retention voltage determination circuits including said retention voltage determination circuitry.

8. An apparatus, comprising:
a semiconductor chip, comprising:
a memory comprising multiple storage cells, said storage cells to receive a supply voltage; and,
retention voltage determination circuitry, said retention voltage determination circuitry to determine a level of said supply voltage at which said storage cells are able to retain their respective data, said retention voltage determination circuitry comprising a plurality of storage cells to receive said supply voltage during a stress mode of said retention voltage determination circuitry, said retention voltage retention determination circuitry to apply a voltage that is less than said supply voltage to said plurality of storage cells during a measurement mode of said retention voltage determination circuitry cause said plurality of storage cells to more weakly retain their stored information than said memory's multiple storage cells during said measurement mode, said plurality of storage cells having their respective data output nodes coupled together.

9. The apparatus of claim 8 wherein said retention voltage determination circuitry comprises a first supply current path and a second supply current path, the first supply current path to impose negligible supply voltage drop, the second supply current path to impose a non-negligible supply voltage drop, the first supply current path to be enabled during the stress mode, the second supply current path to be enabled during the measurement mode.

10. The apparatus of claim 9 wherein the second current path comprises one or more diodes.

11. The apparatus of claim 8 wherein said plurality of storage cells each comprise more pull-up transistors than respective ones of said memory's multiple storage cells.

12. The apparatus of claim 8 wherein said retention voltage determination circuitry comprises different numbers of transistors on different legs of said retention voltage determination circuitry.

13. The apparatus of claim 8 wherein said semiconductor chip comprises a power management controller and said retention voltage determination circuitry is coupled to said power management controller.

14. A computing system, comprising:
a semiconductor chip, comprising:
    a plurality of processing cores;
    a memory controller;
    a memory comprising multiple storage cells, said storage cells to receive a supply voltage; and,
    retention voltage determination circuitry, said retention voltage determination circuitry to determine a level of said supply voltage at which said storage cells are able to retain their respective data, said retention voltage determination circuitry comprising a storage cell to receive said supply voltage during a stress mode of said retention voltage determination circuitry, said retention voltage determination circuitry to apply a voltage that is less than said supply voltage to said storage cell during a measurement mode of said retention voltage determination circuitry to cause said storage cell to more weakly retain its stored information than said storage cells during said measurement mode, said measurement mode to determine a minimum supply voltage for said storage cells.

15. The computing system of claim 14 wherein said retention voltage determination circuitry comprises a first supply current path and a second supply current path, the first supply current path to impose negligible supply voltage drop, the second supply current path to impose a non-negligible supply voltage drop, the first supply current path to be enabled during the stress mode, the second supply current path to be enabled during the measurement mode.

16. The computing system of claim 15 wherein the second current path comprises one or more diodes.

17. The computing system of claim 14 wherein said storage cell has more pull-up transistors than respective ones of said storage cells.

18. The computing system of claim 14 wherein said semiconductor chip comprises a power management controller and said supply voltage retention circuitry is coupled to said power management controller.

19. The computing system of claim 14 wherein said memory is to implement a cache for said processing cores.

* * * * *